(12) United States Patent
Fukaishi

(10) Patent No.: US 6,377,127 B1
(45) Date of Patent: Apr. 23, 2002

(54) PHASE LOCKED LOOP CIRCUIT

(75) Inventor: Muneo Fukaishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/711,407

(22) Filed: Nov. 13, 2000

(30) Foreign Application Priority Data

Nov. 10, 1999 (JP) .......................................... 11-318997

(51) Int. Cl.⁷ .............................. H03L 7/08; H03L 7/089
(52) U.S. Cl. ..................... 331/17; 331/1 A; 327/156; 327/159; 375/376
(58) Field of Search ...................... 331/1 A, 17, 18, 331/25; 327/156–159; 360/51; 375/376; 455/260

(56) References Cited

U.S. PATENT DOCUMENTS 3,651,416 A * 3/1972 Hobrough .................. 328/133

* cited by examiner

*Primary Examiner*—David Mis
(74) *Attorney, Agent, or Firm*—Hayes, Soloway, Hennessey, Grossman & Hage P.C.

(57) ABSTRACT

In a phase locked loop circuit, a phase difference signal (an up signal and a down signal) is supplied from a phase comparator to a serial-to-parallel converting circuit, and an output of the serial-to-parallel converting circuit is supplied to an up-down counter having a count value is counted up or down in accordance with the phase difference detected by the phase comparator. A voltage controlled oscillator generates an oscillation signal having the frequency controlled in accordance with the count value of the up-down counter. Thus, since the phase difference signal is serial-to-parallel converted, the rate of the phase difference signal is lowered, so that the operation speed of the up-down counter can be relaxed. Therefore, the operation speed of the phase locked loop circuit can be elevated with elevating the operation speed of the up-down counter.

12 Claims, 6 Drawing Sheets

Fig. 2
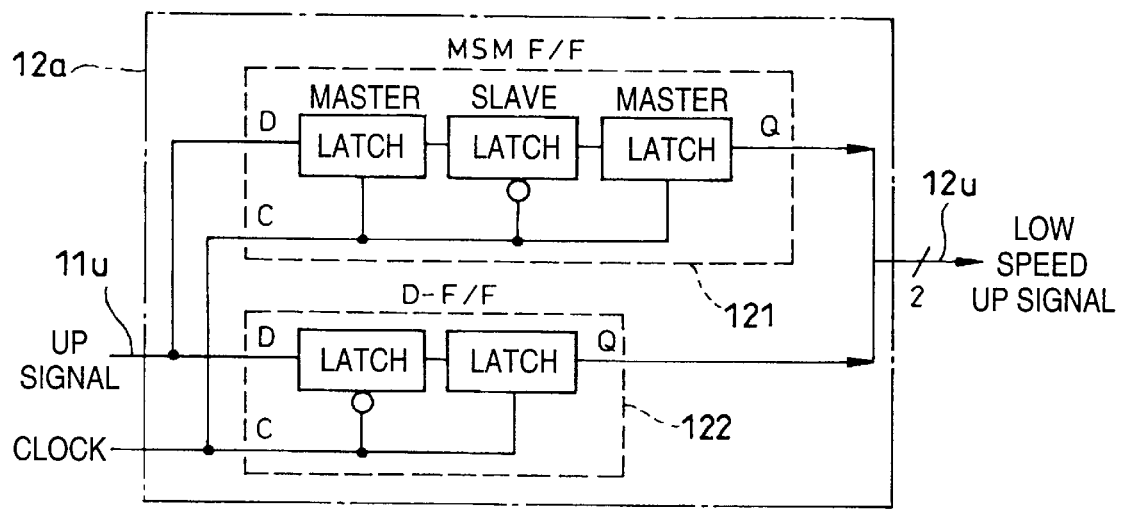
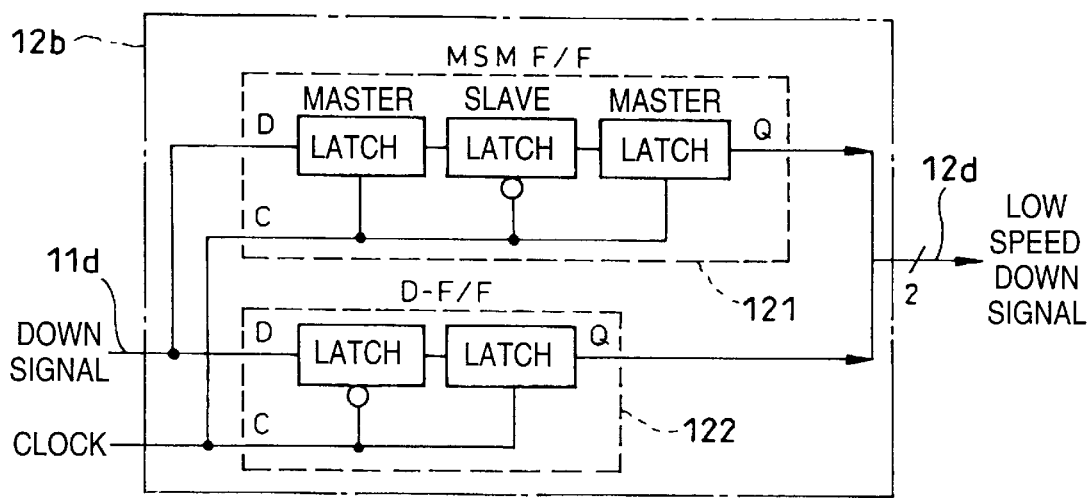

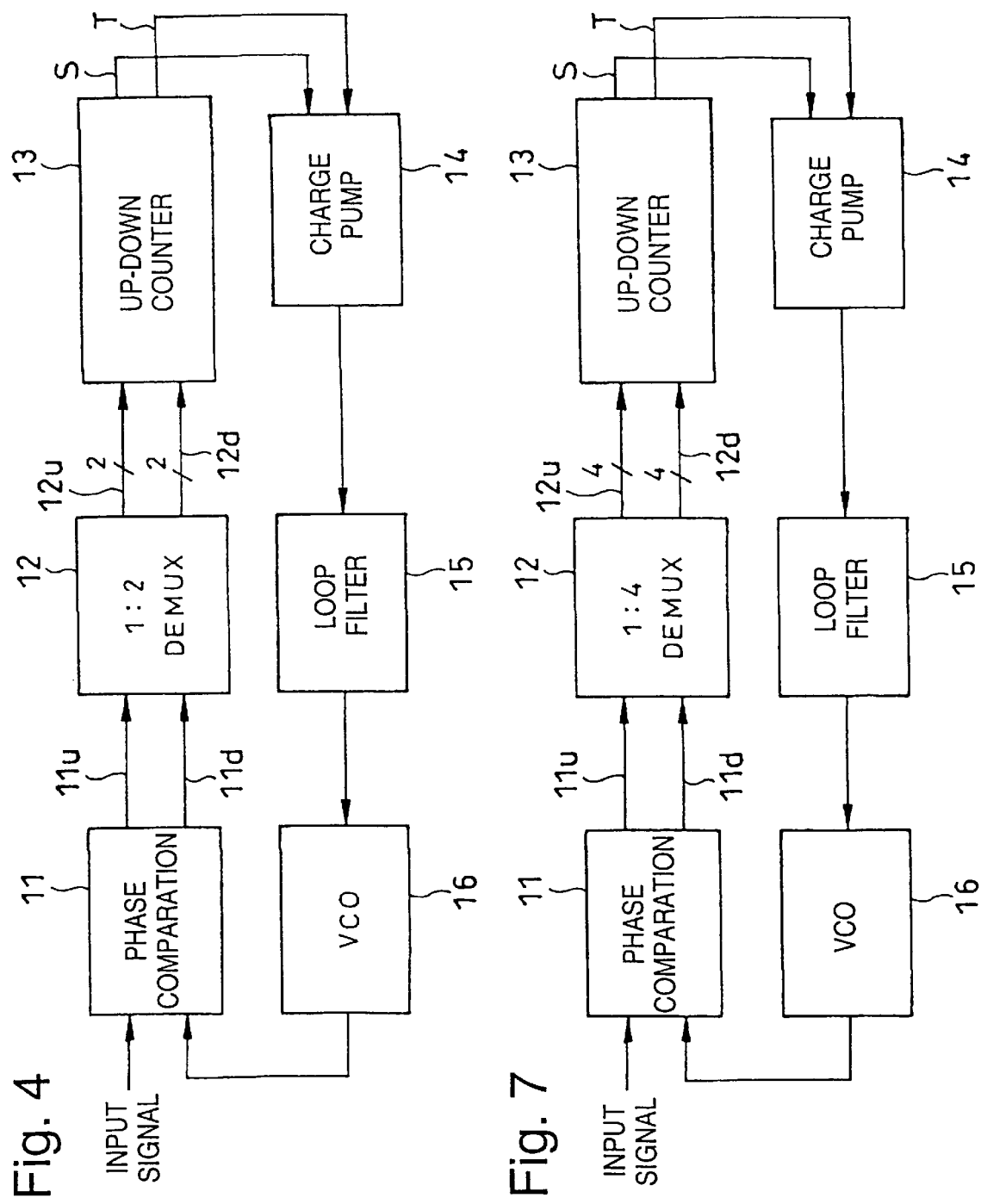

| NUMBER OF LOW SPEED UP SIGNALS | NUMBER OF LOW SPEED DOWN SIGNALS | VALUE OF COUNTER |
|---|---|---|
| 0 | 0 | 0 |
| 0 | 1 | −1 |
| 0 | 2 | −2 |
| 1 | 0 | +1 |
| 1 | 1 | 0 |
| 1 | 2 | −1 |
| 2 | 0 | +2 |
| 2 | 1 | +1 |
| 2 | 2 | 0 |

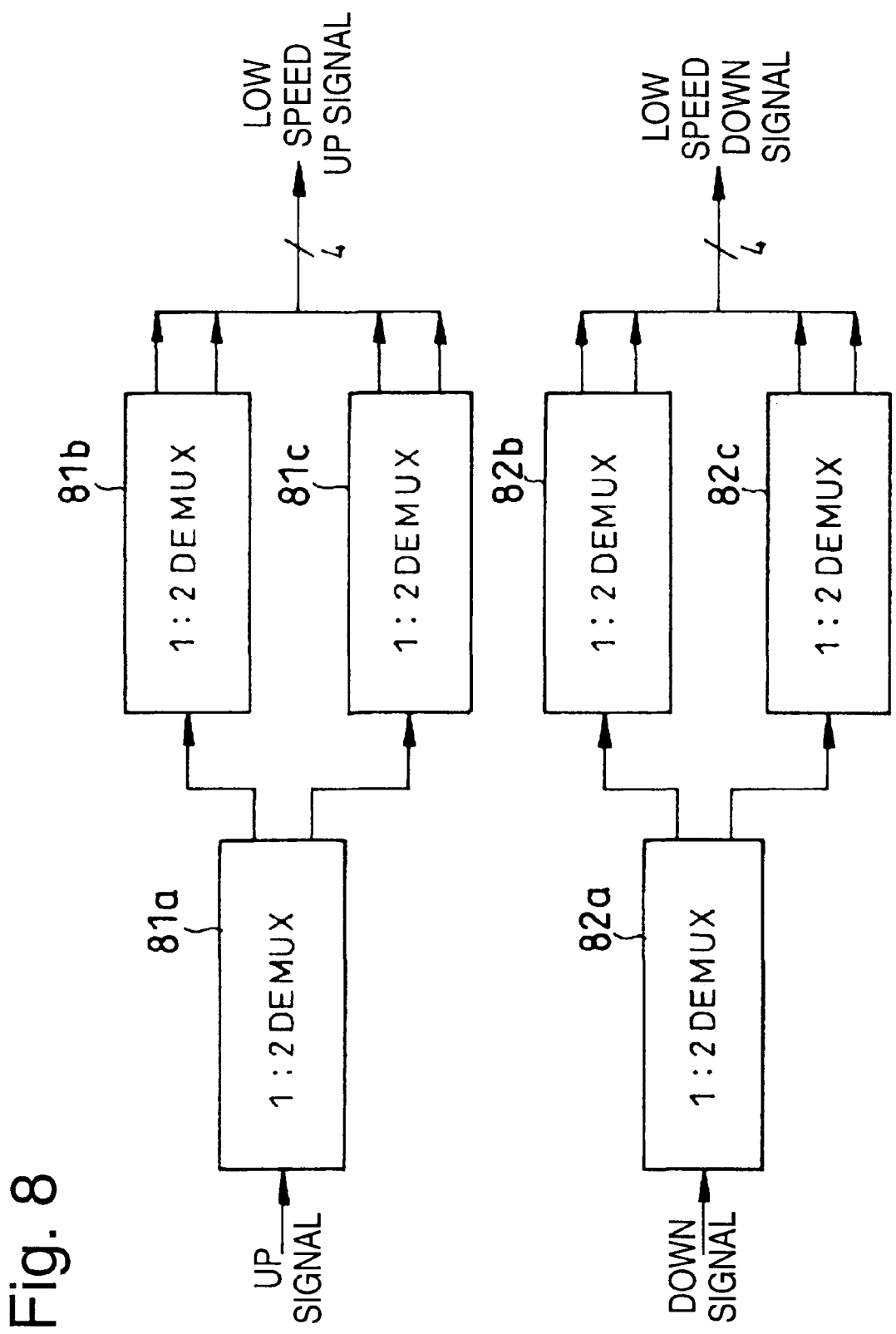

PHASE LOCKED LOOP CIRCUIT

BACKGROUND OF THE INVENTION

The present invention relates to a PLL (phase locked loop) circuit, and more specifically to a PLL circuit used for a clock generation and a data reproduction.

In the field of communication, a PLL circuit is widely used for extracting a clock component from a received data. In the PLL circuit used for a clock or data regeneration, when the clock component is extracted from the received data, a phase comparing circuit is used for comparing the phase where the data changes, with the phase of a clock generated in the PLL circuit, so as to detect a phase difference. This phase comparing circuit can be classified into two types based on the method for outputting a difference in phase between two input signals. Namely, a first type is a so called linear system for outputting the phase difference in an analog expression, and a second type is a binary system of expressing the phase difference by only a binary value.

In the linear system, the width of a phase difference signal is caused to change in accordance with the phase difference, so that the output of the phase comparing circuit includes the information indicative of the degree of the phase difference. In the binary system, on the other hand, only which of the two input signal is in advance is discriminated for outputting the result of the comparison, and therefore, the information indicative of the degree of the phase difference does not exits. Accordingly, in the case of making a precise comparison, the linear system is used in many case. However, the phase comparing circuit of the binary system outputs the phase difference having the degree of precision inferior to that of the phase difference obtained in the linear system, but advantageously operates in a high speed.

Recently, with an elevation in the communication speed, the data speed and the clock speed handled in the PLL circuit for extracting the clock and the data are correspondingly elevated. Accordingly, it is required to increase the operation speed of the phase comparing circuit. The reason for this is that, since the phase comparing circuit used in the PLL circuit for the regeneration of the clock and the data compares the inputted transmission data and the clock generated in the PLL circuit, the phase comparing circuit is required to operate at the speed of the inputted data. Therefore, in the clock and data regenerating PLL circuit used in the high speed communication, the phase comparing circuit of the binary system capable of operating at a high speed is required in many cases.

Furthermore, in a multiplying PLL circuit configured to generate a clock which is in synchronism with an external clock and which has a clock frequency higher than that of the external clock, the clock frequency handled correspondingly becomes high. Therefore, the phase comparing circuit used in the multiplying PLL circuit is required to be correspondingly speeded up.

Referring to FIG. 10, there is shown a block diagram of one example of the clock and data regenerating PLL circuit using the prior art phase comparing circuit of the binary system. The shown PLL circuit comprises a phase comparing circuit 11, an up-down counter 13, a charge pump 14, a loop filter 15 and a VCO (voltage controlled oscillator) 16, which are connected as shown.

In this arrangement, an input signal and an output signal of the VCO 16 are supplied to the phase comparing circuit 11, where both the signals are phase-compared. The result of this phase comparison is outputted as a up signal 11u or a down signal 11d, which causes the up-down counter 13 to perform an up-count operation or a down-count operation.

The up-down counter 13 outputs a phase advancing signal S or a phase delaying signal T, which are supplied to the charge pump 14. This charge pump 14 includes a pair of transistors (not shown) which are operated by the phase advancing signal S or the phase delaying signal T, respectively, and which are connected in series between a power supply voltage and ground, so that an output is derived from a connection node between the pair of transistors.

An output of the charge pump 14 is supplied to the loop filter 15, so that a capacitor in the loop filter 15 is charged or discharged. The electric charge accumulated in this capacitor is supplied as a control voltage to the VCO 16, so that the oscillation frequency of the VCO is controlled. Namely, if the capacitor in the loop filter 15 is charged by the phase advancing signal S, the control voltage is elevated so that the oscillation frequency of the VCO is elevated. On the other hand, if the capacitor in the loop filter 15 is discharged by the phase delaying signal T, the control voltage is elevated so that the oscillation frequency of the VCO is lowered.

In brief, in the shown circuit, the oscillation frequency of the VCO 16 is controlled in accordance with the phase advanced or delayed condition, so that it is possible to obtain an oscillation output signal which has the same frequency as that of the input signal and which is in the same phase as that of the input signal.

Incidentally, the PLL circuit can be constituted by replacing the phase comparing circuit, with a frequency comparing circuit of a circuit which performs a frequency comparison and a phase comparison.

However, the output of the phase comparing circuit of the binary system is the up signal 11u or the down signal 11d having the constant width, which merely indicates either the phase advancement or the phase delay, for example as a phase difference signal having the width corresponding to one item of data. Therefore, in the phase comparing circuit of the binary system, even after the PLL circuit has become a stable condition, the phase comparing circuit continues to output the up signal 11u or the down signal 11d. Therefore, after the clock signal of the PLL circuit becomes the stable condition, the clock signal of the PLL circuit alternatively becomes in advance or delayed (this will be called a "bang-bang operation" hereinafter).

In the prior art, in order to make small the amount of change of the clock frequency caused by the bang-bang operation in the PLL circuit of the binary system, the output of the phase comparing circuit 11 is not supplied directly to the charge pump 14, but the up signal 11u and the down signal 11d are supplied to the up-down counter 13 to suppress the bang-bang operation. The up-down counter 13 is constituted of an adding/subtracting circuit which receives both the up signal 11u and the down signal 11d, so that when the total of the up signal 11u or the down signal 11d exceeds a certain value, the phase delaying signal T or the phase advancing signal S is outputted to the charge pump 14.

For example, it is assumed that the up signal and the down signal supplied to the up-down counter 13 is +1 and −1, respectively and an initial value of the up-down counter 13 is "0". For example, when the count value of the up-down counter 13 becomes +8, the phase advancing signal S is outputted to the charge pump 14, or when the count value of the up-down counter 13 becomes −8, the phase delaying signal T is outputted to the charge pump 14. The bang-bang operation occurring when the PLL circuit becomes the stable condition is absorbed by the up-down counter 13, with the result that the PLL circuit has an increased degree of stability.

However, if the speed of the transmission signal becomes further high, the up-down counter formed of the adding/subtracting circuit becomes inoperable, with the result that the operation speed of the PLL circuit is limited by the up-down counter.

The reason for this is as follows: The up-down counter includes a synchronous circuit operating with the clock having the same frequency as that of the up signal or the down signal supplied to the up-down counter. In addition, when the phase comparing circuit of the binary system is used, the up signal and the down signal is outputted at a speed in accordance with the data transmission rate. For example, the data transmission rate is 1 Gb/s (b/s is bit per second), the up signal or the down signal is outputted at 1 Gb/s. Accordingly, the count operation of the up-down counter is executed at the period of 1 GHz.

The up-down counter is constituted of the adding/subtracting circuit. When this adding/subtracting circuit is constituted of a synchronous circuit operating in synchronism with the clock, the adding/subtracting circuit is constituted of a flipflop circuit and a selector. Accordingly, since the up signal and the down signal is inputted at a rate exceeding the operating speed of the adding/subtracting circuit, the up-down counter becomes inoperable. The rate of the up signal and the down signal changes in proportion to the data transmission rate.

For the reason mentioned above, if the data transmission rate becomes high, the up-down counter becomes inoperable. Accordingly, the speed-up of the operation is prevented by limiting the operation speed of the PLL circuit by the up-down counter.

BRIEF SUMMARY OF THE INVENTION

Accordingly, it is an object of the present invention to provide a PLL circuit which has overcome the above mentioned defect of the prior art.

Another object of the present invention is to provide a PLL circuit having an elevated operation speed.

The above and other objects of the present invention are achieved in accordance with the present invention by a phase locked loop circuit comprising a phase comparing means for phase-comparing an input signal with an oscillation signal, an up-down counter having a count value is counted up or down in accordance with the result of phase comparison of the phase comparing means, an oscillating means for generating the oscillation signal having the frequency controlled in accordance with the count value of the up-down counter, wherein the result of phase comparison of the phase comparing means is a serial signal, and there is provided a serial-to-parallel converting means for converting the serial signal into a parallel signal, and the count value of the up-down counter is counted up or down in accordance with the parallel signal.

Here, for example, the serial signal is a signal having a constant width indicative of the result of phase comparison.

In addition, the serial-to-parallel converting means is constituted of a {1:n} demultiplexor circuit for converting the serial signal into the parallel signal composed of "n" bits where "n" is a natural number not less than "2", for example, a {1:2} demultiplexor circuit for converting the serial signal into the parallel signal composed of "2" bits, or a {1:4} demultiplexor circuit for converting the serial signal into the parallel signal composed of "4" bits.

Furthermore, the input signal is a NRZ signal and the phase locked loop circuit regenerates a synchronous signal based on the NRZ signal. Alternatively, the input signal is an external signal and the phase locked loop circuit operates as a multiplying PLL circuit which regenerates a synchronous signal in synchronism with the external signal. Incidentally, the serial-to-parallel converting means is provided between the phase comparing means and the up-down counter.

As seen from the above, the phase locked loop circuit in accordance with the present invention is characterized by comprising a circuit for serial-to-parallel converting the result of comparison outputted from the phase comparing circuit that phase-compares the two signals. This serial-to-parallel converting means is constituted of a {1:n} demultiplexor circuit for converting the serial signal into the parallel signal composed of "n" bits where "n" is a natural number not less than "2". In addition, the serial-to-parallel converting means is provided between the phase comparing means and the up-down counter.

The above and other objects, features and advantages of the present invention will be apparent from the following description of preferred embodiments of the invention with reference to the accompanying drawings.

BRIEF DESCRIPTION OF THE DRAWINGS

FIG. 2 is a block diagram of the demultiplexor circuit in the phase locked loop circuit shown in FIG. 1;

FIG. 4 is a block diagram of a first embodiment of the phase locked loop circuit in accordance with the present invention;

FIG. 7 is a block diagram of a second embodiment of the phase locked loop circuit in accordance with the present invention;

FIG. 8 is a block diagram of the demultiplexor in the phase locked loop circuit shown in FIG. 7;

DETAILED DESCRIPTION OF THE INVENTION

The phase locked loop circuit in accordance with the present invention will be described with reference to the accompanying drawings. In all the figures, equivalent portions are given the same reference numbers.

Figure 1:
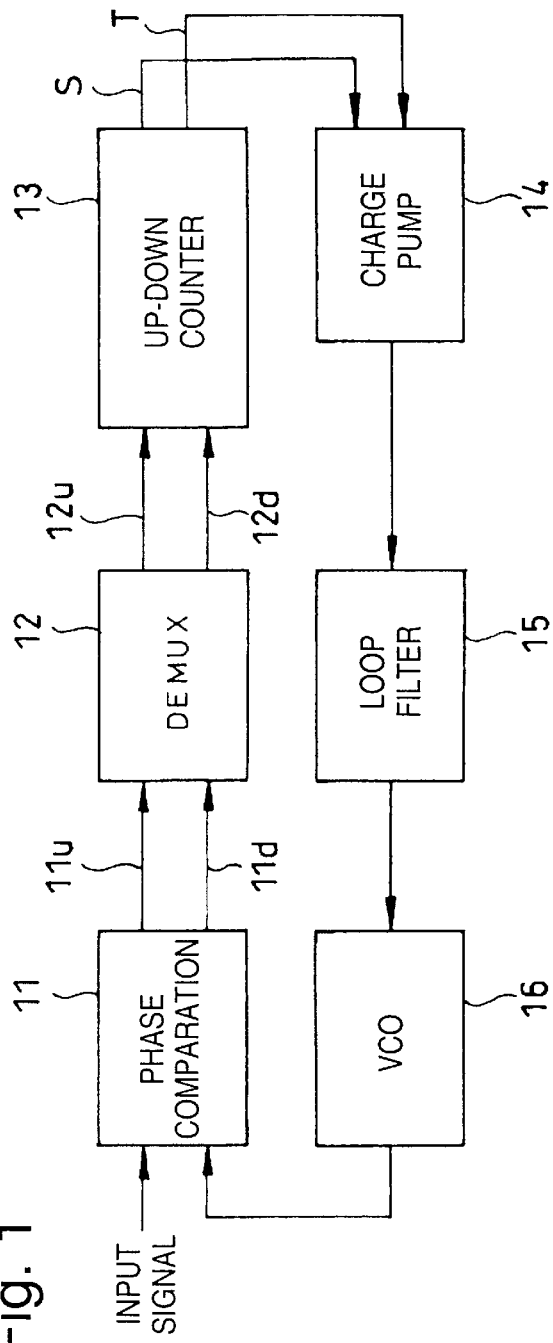
FIG. 1 is a block diagram of the phase locked loop circuit in accordance with the present invention.

Referring to FIG. 1, there is shown a block diagram of the phase locked loop circuit in accordance with the present invention. The shown phase locked loop circuit is a PLL circuit for regenerating a clock and data, and comprises a phase comparing circuit 11, a serial-to-parallel converting circuit (demultiplexor circuit) 12, an up-down counter 13, a charge pump 14, a loop filter 15, and a VCO 16, connected as shown.

An input signal supplied to the phase comparing circuit 11 is for example a well-known NRZ (no return to zero) signal, and the VCO 16 generates a signal which has the same frequency as that of the input signal and which is in the same phase as that of the input signal.

Figure 10:
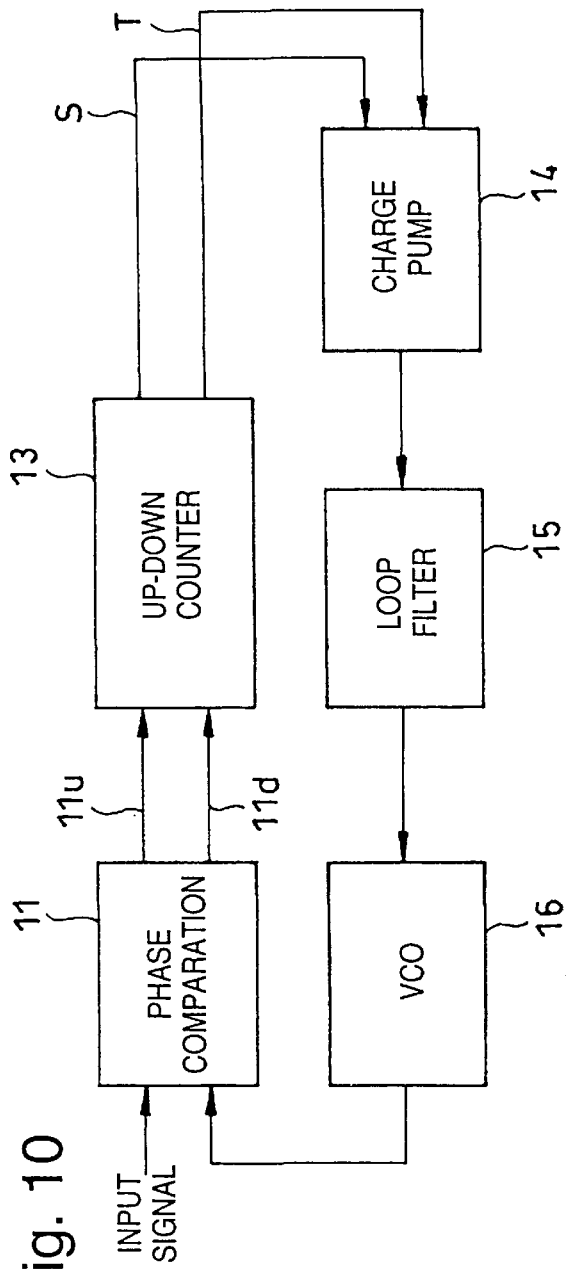
FIG. 10 is a block diagram of the phase locked loop circuit in the prior art.

Differently from the prior art circuit (as shown in FIG. 10), this PLL circuit comprises the demultiplexor circuit 12 provided between the phase comparing circuit 11 and the up-down counter 13, for lowering the speed (transmission rate) of the up signal 11*u* and the down signal 11*d* outputted from the phase comparing circuit 11. As a result, a low speed up signal 12*u* and a low speed down signal 12*d* outputted from the demultiplexor circuit 12 are slower in data transmission speed than the up signal 11*u* and the down signal 11*d* outputted from the phase comparing circuit 11. Accordingly, the operation speed required in the up-down counter 13 is relaxed in comparison with the prior art circuit having no demultiplexor circuit.

An example of the construction of the demultiplexor circuit 12 will be described with reference to FIG. 2. As shown in FIG. 2, the demultiplexor circuit 12 includes a pair of demultiplexors 12*a* and 12*b*, which receive the up signal 11*u* and the down signal 11*d*, respectively, and which are controlled by a clock to generate the low speed up signal 12*u* and the low speed down signal 12*d*, respectively. Each of the demultiplexors 12*a* and 12*b* comprises a master-slave-master (MSM) type flipflop 121 and a D-type flipflop 122, connected as shown. Since the demultiplexors 12*a* and 12*b* have the same construction, only the demultiplexor 12*a* will be described.

The MSM type flipflop 121 includes three cascade-connected latches. The up signal 11*u* is sequentially held in these cascade-connected latches of the MSM type flipflop 121 in such a manner that the up signal 11*u* is held in a first stage latch at a rising of a first clock, and then, is held in a second stage latch at a falling of the first clock, and thereafter, is held in a third stage latch at a rising of a second clock.

On the other hand, the D-type flipflop 122 includes two cascade-connected latches. The up signal 11*u* is sequentially held in these cascade-connected latches of the D-type flipflop 122 in such a manner that the up signal 11*u* is held in a first stage latch at a falling of the first clock, and then, is held in a second stage latch at a rising of a second clock.

Thus, the demultiplexor 12*a* outputs an output of the third stage latch in the MSM type flipflop 121 and an output of the second stage latch in the D-type flipflop 122 as the low speed up signal 12*u* (which is composed of two bits in the case shown in FIG. 2). Similarly, the demultiplexor 12*b* outputs an output of the third stage latch in the MSM type flipflop 121 and an output of the second stage latch in the D-type flipflop 122 as the low speed down signal 12*d* (which is composed of two bits in the case shown in FIG. 2).

Figure 3:
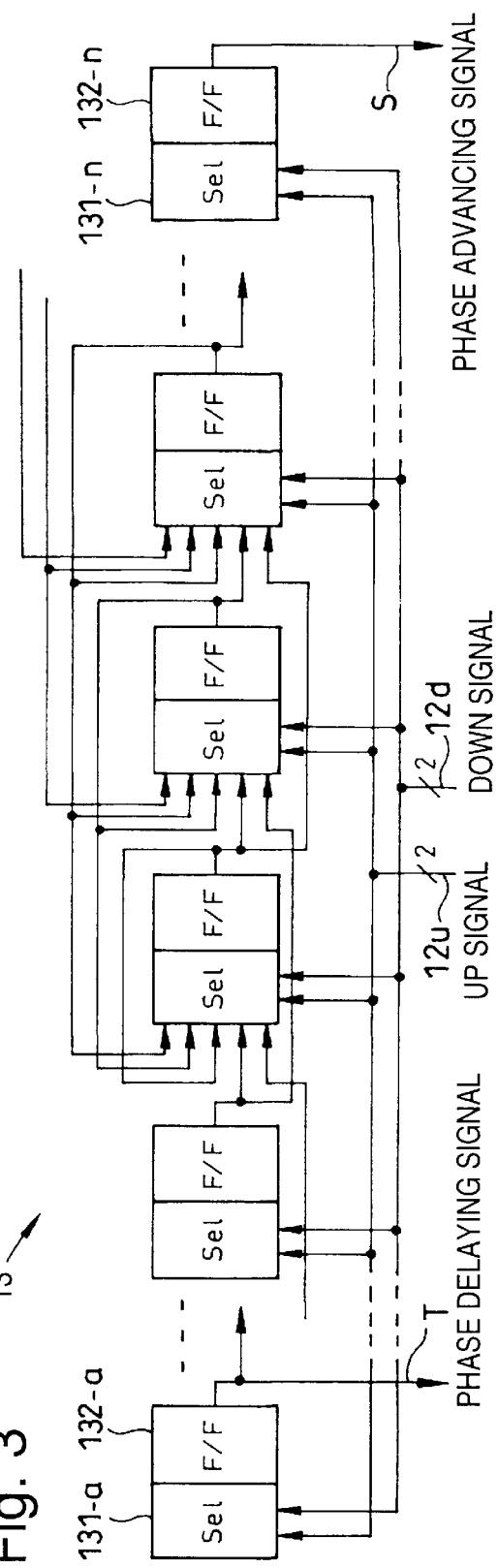
FIG. 3 is a block diagram of the up-down counter in the phase locked loop circuit shown in FIG. 1.

Next, an example of the construction of the up-down counter 13 shown in FIG. 1 will be described with reference to FIG. 3. As shown in FIG. 3, the up-down counter 13 is constituted of "n" cascade-connected circuits, each of which is composed of a {5:1} selector (Sel) 131*a* to 131*n* controlled by the low speed up signal 12*u* and the low speed down signal 12*d*, and a flipflop (F/F) 132*a* to 132*n* for holding an output of the associated {5:1} selector, where "n" is a natural number. Each selector receives an output of the flipflop of the stage before the just preceding stage, an output of the flipflop of the just preceding stage, an output of the associated flipflop, an output of the flipflop of the just succeeding stage, and an output of the flipflop of the stage after the just succeeding stage. One signal is selected from these five signals in accordance with four bits in total of the low speed up signal 12*u* and the low speed down signal 12*d*. An output of the flipflop 132*a* of the first stage constitutes a phase delaying signal T, and an output of the flipflop 132*n* of the final stage constitutes a phase advancing signal S. An operation of the up-down counter 13 will be described hereinafter.

Referring to FIG. 4, there is shown a block diagram of a first embodiment of the phase locked loop circuit in accordance with the present invention. This PLL circuit comprises a phase comparing circuit 11, a demultiplexor circuit 12, an up-down counter 13, a charge pump 14, a loop filter 15, and a VCO 16, connected as shown.

Figures 5, 6:
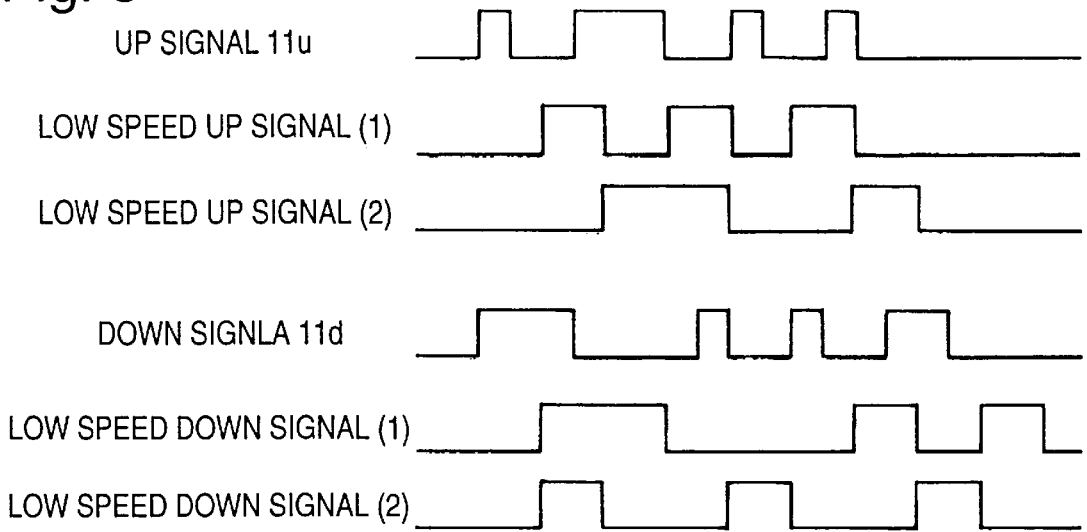
FIG. 5 is a timing chart illustrating an operation of the phase locked loop circuit shown in FIG. 1.
FIG. 6 is a table illustrating the operation of the phase locked loop circuit shown in FIG. 1.

In this embodiment, the demultiplexor circuit 12 for relaxing the transmission rate of the up signal 11*u* and the down signal 11*d* outputted from the phase comparing circuit 11, is constituted of a {1:2} demultiplexor circuit. Therefore, in response to the up signal 11*u* and the down signal 11*d* outputted from the phase comparing circuit 11 (both of which are a serial signal), the demultiplexor circuit 12 outputs the low speed up signal constituted of two bits in parallel (a low speed up signal (1) and a low speed up signal (2) as shown in FIG. 5) and the low speed down signal constituted of two bits in parallel (a low speed down signal (1) and a low speed down signal (2) as shown in FIG. 5). Namely, the demultiplexor circuit 12 outputs an output signal of four bits in parallel. As a result, the output signal of the demultiplexor circuit 12 can have the transmission rate which is a half of the transmission rate of the input signals of the demultiplexor circuit 12. These four low speed signals are supplied to the up-down counter 13.

The up-down counter 13 changes its count value in response to the inputted four low speed signals, as shown in FIG. 6. For example, when the two low speed up signals (1) and (2) are inputted but neither of the two low speed down signals (1) and (2) are inputted, the value of the up-down counter 13 is incremented by "+2". On the other hand, when neither of the two low speed up signals (1) and (2) are inputted but the two low speed down signals (1) and (2) are inputted, the value of the up-down counter 13 is incremented by "-2". When both the low speed up signals and the low speed down signals are inputted, the incremented value of the up-down counter is determined by comparing the number of the low speed up signals with the number of the low speed down signals, as shown in the table of FIG. 6.

For example, when the two low speed up signals (1) and (2) are inputted and the two low speed down signals (1) and (2) are inputted, the incremented value of the up-down counter becomes "0". When the two low speed up signals are inputted and one low speed down signal is inputted, the incremented value of the up-down counter becomes "+1". When one low speed up signal is inputted and the two low speed down signals are inputted, the incremented value of the up-down counter becomes "-1". When none of the low speed up signals and the low speed down signals is inputted, the incremented value of the up-down counter becomes "0".

By inserting the demultiplexor circuit 12, the structure of the up-down counter 13 becomes complicated. However, since the transmission rate of the up signal and the down signal supplied to the up-down counter 12 becomes a half, the operation speed required in the up-down counter 12 correspondingly becomes a half.

Referring to FIG. 7, there is shown a block diagram of a second embodiment of the phase locked loop circuit in accordance with the present invention. This PLL circuit comprises a phase comparing circuit 11, a demultiplexor circuit 12, an up-down counter 13, a charge pump 14, a loop filter 15, and a VCO 16, connected as shown. The up-down counter 13 shown in FIG. 7 are constituted by replacing the {5:1} selectors in the construction shown in FIG. 3 with {9:1} selectors.

Furthermore, in this embodiment, the demultiplexor circuit 12 for relaxing the transmission rate of the up signal 11u and the down signal 11d outputted from the phase comparing circuit 11, is constituted of a {1:4} demultiplexor circuit. An structure of the {1:4} demultiplexor circuit 12 will be described with reference to FIG. 8.

In order to derive the low speed up signal 12u from the up signal 11u, the up signal 11u is supplied to a {1:2} demultiplexor circuit 81a having an output connected to an input of each of two {1:2} demultiplexor circuits 81b and 81c, which generate the low speed up signal 12u of four bits in total. In order to derive the low speed down signal 12d from the down signal 11d, the down signal 11d is supplied to a {1:2} demultiplexor circuit 82a having an output connected to an input of each of two {1:2} demultiplexor circuits 82b and 82c, which generate the low speed down signal 12d of four bits in total. Each of the demultiplexor circuits 81a to 81c and 82a to 82c has the same construction as that of the demultiplexor circuits 12a and 12b shown in FIG. 2. Thus, the {1:4} demultiplexor circuit 12 can be constructed.

In the embodiment shown in FIG. 7, as mentioned above, the demultiplexor circuit 12 for relaxing the transmission rate of the up signal 11u and the down signal 11d outputted from the phase comparing circuit 11, is constituted of the {1:4} demultiplexor circuit. Therefore, in response to the up signal 11u and the down signal 11d outputted from the phase comparing circuit 11 (both of which are a serial signal), the demultiplexor circuit 12 outputs the low speed up signal constituted of four bits in parallel and the low speed down signal constituted of four bits in parallel. Namely, the demultiplexor circuit 12 outputs an output signal of eight bits in parallel. These eight low speed signals are supplied to the up-down counter 13. The incremented or decremented value of the up-down counter 13 is determined by comparing the number of the low speed up signals with the number of the low speed down signals.

In this second embodiment, by inserting the {1:4} demultiplexor circuit 12, the structure of the up-down counter 13 becomes complicated. However, since the speed (transmission rate) of the up signal and the down signal supplied to the up-down counter 12 becomes one fourth, the operation speed required in the up-down counter 12 correspondingly becomes one fourth.

In the above mentioned two embodiments, the demultiplexor circuit 12 for serial-to-parallel converting the up signal 11u and the down signal 11d outputted from the phase comparing circuit 11 is provided between the phase comparing circuit 11 and the up-down counter 13, the operation speed required in the up-down counter 12 can be relaxed in accordance with the serial-to-parallel conversion number of the demultiplexor circuit 12. Namely, using a {1:n} demultiplexor circuit for converting the serial signal into the parallel signal composed of "n" bits where "n" is a natural number not less than "2", the operation speed required in the up-down counter 12 can be relaxed to 1/n.

Figure 9:
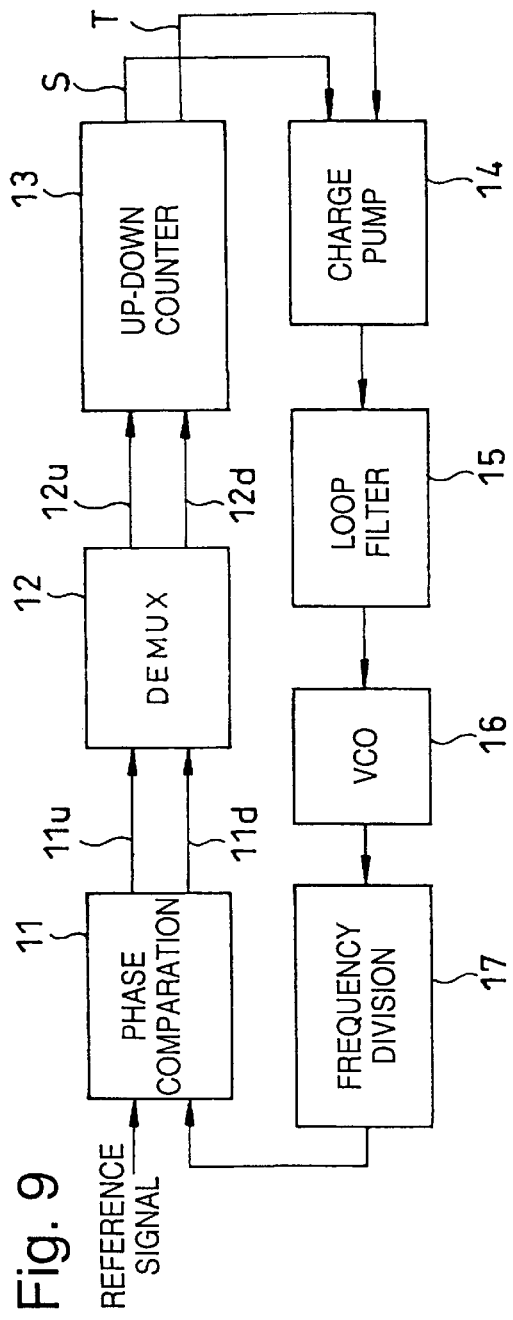
FIG. 9 is a block diagram of a third embodiment of the phase locked loop circuit in accordance with the present invention.

Referring to FIG. 9, there is shown a block diagram of a third embodiment of the phase locked loop circuit in accordance with the present invention. This PLL circuit is a multiplying PLL circuit, and comprises a phase comparing circuit 11, a serial-to-parallel converting circuit (demultiplexor circuit) 12, an up-down counter 13, a charge pump 14, a loop filter 15, a VCO 16 and a frequency divider 17, connected as shown.

The shown multiplying PLL circuit can generate a clock having a frequency which is "m" times the frequency of a reference signal supplied to the phase comparing circuit 11, where "m" is a positive integer not less than 2, such as 2, 3, 4, . . . This multiplying PLL circuit operates to make the phase and the frequency of the signal obtained by frequency-dividing the output of the VCO 16, consistent with the phase and the frequency of the reference signal, respectively. Accordingly, if the frequency dividing ratio is "2", the oscillation frequency of the VCO 16 is two times the frequency of the reference signal. If the frequency dividing ratio is "3", the oscillation frequency of the VCO 16 is three times the frequency of the reference signal. Namely, it is possible to obtain the frequency in proportion to the frequency dividing ratio of the frequency divider. In order to have this clock multiplying function, the frequency divider is inserted in this embodiment.

In this embodiment of the PLL circuit, tie demultiplexor circuit 12 for lowering the speed of the up signal 11u and the down signal 11d outputted from the phase comparing circuit 11 is provided between the phase comparing circuit 11 and the up-down counter 13. Therefore, a low speed up signal 12u and a low speed down signal 12d inputted to the up-down counter 13 are slower than the up signal 11u and the down signal 11d outputted from the phase comparing circuit 11. Accordingly, the operation speed required in the up-down counter 13 is relaxed in comparison with the prior art circuit having no demultiplexor circuit 12.

Accordingly, the PLL circuit can be speeded up in accordance with the serial-to-parallel conversion number of the demultiplexor circuit 12. For example, if the {1:2} demultiplexor circuit 12 is used, the operation speed required in the up-down counter 12 becomes a half. If the {1:4} demultiplexor circuit 12 is used, the operation speed required in the up-down counter 12 becomes one fourth.

As mentioned above, in the multiplying PLL circuit as in the third embodiment, similarly to the clock and data regenerating PLL circuit of the first and second embodiments, by inserting the demultiplexor circuit 12 for serial-to-parallel converting the up signal 11u and the down signal 11d outputted from the phase comparing circuit 11, between the phase comparing circuit 11 and the up-down counter 13, the operation speed required in the up-down counter 12 can be relaxed in accordance with the serial-to-parallel conversion number of the demultiplexor circuit 12. Namely, using a {1:n} demultiplexor circuit for converting the serial signal into the parallel signal composed of "n" bits where "n" is a natural number not less than "2", the operation speed required in the up-down counter 12 can be relaxed to 1/n.

In the above mentioned embodiments, it would be apparent to persons skilled in the art that the phase comparing circuit can be replaced with a frequency comparing circuit or a frequency and phase comparing circuit. In the former case, the result of frequency comparison outputted from the frequency comparing circuit is supplied to a serial-to-parallel converting circuit, and an output of the serial-to-parallel converting circuit is a parallel signal and supplied to the up-down counter. In the latter case, the result of comparison outputted from the frequency and phase comparing circuit is supplied to a serial-to-parallel converting circuit, and an output of the serial-to-parallel converting circuit is a parallel signal and supplied to the up-down counter.

As seen from the above, in the PLL circuit so configured that the oscillation frequency of the VCO is controlled in accordance with the count value of the up-down counter which is incremented and decremented on the basis of the result of the phase comparison between the input signal and the oscillation signal, there is provided the serial-to-parallel converting circuit for converting the serial signal indicative of the result of the phase comparison into the parallel signal, which is supplied to the up-down counter to change the count value of the up-down counter. Therefore, the operating speed of the up-down counter, which limits the operation speed of the PLL circuit in the prior art, can be relaxed, with the result that the operation speed of the PLL circuit can be elevated.

The invention has thus been shown and described with reference to the specific embodiments. However, it should be noted that the present invention is in no way limited to the details of the illustrated structures but changes and modifications may be made within the scope of the appended claims.

What is claimed is:

1. A phase locked loop circuit comprising a phase comparing means for phase-comparing an input signal with an oscillation signal, an up-down counter having a count value is counted up or down in accordance with the result of phase comparison of said phase comparing means, an oscillating means for generating said oscillation signal having the frequency controlled in accordance with the count value of said up-down counter, wherein the result of phase comparison of said phase comparing means is a serial signal, and there is provided a serial-to-parallel converting means for converting said serial signal into a parallel signal, and the count value of said up-down counter is counted up or down in accordance with said parallel signal.

2. A phase locked loop circuit claimed in claim 1 wherein said serial signal is a signal having a constant width indicative of the result of phase comparison.

3. A phase locked loop circuit claimed in claim 1 wherein said serial-to-parallel converting means is a {1:n} demultiplexor circuit for converting said serial signal into said parallel signal composed of "n" bits where "n" is a natural number not less than "2".

4. A phase locked loop circuit claimed in claim 1 wherein said serial-to-parallel converting means is a {1:2} demultiplexor circuit for converting said serial signal into said parallel signal composed of "2" bits.

5. A phase locked loop circuit claimed in claim 1 wherein said serial-to-parallel converting means is a {1:4} demultiplexor circuit for converting said serial signal into said parallel signal composed of "4" bits.

6. A phase locked loop circuit claimed in claim 1 wherein said input signal is a NRZ signal and the phase locked loop circuit regenerates a synchronous signal based on said NRZ signal.

7. A phase locked loop circuit claimed in claim 1 wherein said input signal is an external signal and the phase locked loop circuit operates an a multiplying circuit which regenerates a synchronous signal in synchronism with said external signal.

8. A phase locked loop circuit claimed in claim 1 wherein said serial-to-parallel converting means is provided between said phase comparing means and said up-down counter.

9. A phase locked loop circuit claimed in claim 3 wherein said input signal is a NRZ signal and the phase locked loop circuit regenerates a synchronous signal based on said NRZ signal.

10. A phase locked loop circuit claimed in claim 9 wherein said serial-to-parallel converting means is provided between said phase comparing means and said up-down counter.

11. A phase locked loop circuit claimed in claim 3 wherein said input signal is an external signal and the phase locked loop circuit operates an a multiplying circuit which regenerates a synchronous signal in synchronism with said external signal.

12. A phase locked loop circuit claimed in claim 11 wherein said serial-to-parallel converting means is provided between said phase comparing means and said up-down counter.

* * * * *